United States Patent
Force, Jr. et al.

(10) Patent No.: US 12,432,863 B1
(45) Date of Patent: Sep. 30, 2025

(54) SOLDER PREFORM ASSEMBLY AND METHODS OF PREFORMING SOLDER FOR ELECTRONIC BOARD ASSEMBLY

(71) Applicant: Honeywell Federal Manufacturing & Technologies, LLC, Kansas City, MO (US)

(72) Inventors: Timothy Mark Force, Jr., Raymore, MO (US); Lucas Alan Mann, Lee's Summit, MO (US); Bryan Alan Hildreth, Gardner, KS (US)

(73) Assignee: Honeywell Federal Manufacturing & Technologies, LLC, Kansas City, MO (US)

( * ) Notice: Subject to any disclaimer, the term of this patent is extended or adjusted under 35 U.S.C. 154(b) by 0 days.

(21) Appl. No.: 18/899,077

(22) Filed: Sep. 27, 2024

(51) Int. Cl.
*H05K 3/34* (2006.01)

(52) U.S. Cl.
CPC ......... *H05K 3/3478* (2013.01); *H05K 3/3494* (2013.01); *H05K 2203/041* (2013.01); *H05K 2203/043* (2013.01)

(58) Field of Classification Search
None
See application file for complete search history.

(56) References Cited

U.S. PATENT DOCUMENTS

| | | | | |
|---|---|---|---|---|
| 4,842,184 A | * | 6/1989 | Miller, Jr. | B23K 3/06 228/180.1 |
| 5,626,278 A | * | 5/1997 | Tang | H05K 3/3478 228/56.3 |
| 5,730,620 A | * | 3/1998 | Chan | H01R 12/52 439/526 |
| 6,859,370 B1 | * | 2/2005 | Hsu | H05K 7/1061 361/728 |
| 2007/0164082 A1 | * | 7/2007 | Suehiro | H05K 3/306 228/101 |

* cited by examiner

*Primary Examiner* — Devang R Patel
(74) *Attorney, Agent, or Firm* — Erise IP, P.A.

(57) ABSTRACT

Systems and methods for preforming solder on electrical components and completing solder joints between the electrical components and electronic boards are disclosed. In some embodiments, a preload assembly is provided. The preload assembly comprises a base configured with a base recess for receiving a shim and an inset plate. The inset plate comprises a plurality of preload holes configured to receive solder preloads and pins of the electrical components. The preload assembly may be run through a reflow process to bond the solder preload to the pin of the electrical component. Furthermore, the electrical component pin may then be inserted into a pinhole of an electronic board that has been prepared with additional solder preload. A second reflow process may complete the joint between the electrical component and the electronic board.

20 Claims, 7 Drawing Sheets

SOLDER PREFORM ASSEMBLY AND METHODS OF PREFORMING SOLDER FOR ELECTRONIC BOARD ASSEMBLY

STATEMENT OF GOVERNMENT SUPPORT

This invention was made with Government support under Contract No.: DE-NA-0002839 awarded by the United States Department of Energy/National Nuclear Security Administration. The Government has certain rights in the invention.

BACKGROUND

1. Field

Embodiments of the current disclosure relate to solder preforms. More specifically, embodiments of the current disclosure relate to methods of creating solder preforms using a preform assembly.

2. Related Art

Typically, solder preforms are provided for mass soldering of components onto electronic boards. The solder preforms may be placed into pinholes on the electronic boards or on pins of the components to increase the amount of solder bonding pins of components to the board and to the conductors for completing the circuit. In some cases, these preforms are necessary to complete a solder joint to the specifications of a particular use case. These processes present problems as it may be difficult to assemble hundreds of these small, preformed solder bits into the pinholes or on the pins of the components. Furthermore, in many cases, the electronic boards may need to be turned upside down for an assembler to complete the soldering process. Hundreds of small solder preforms disposed in tiny holes then flipped upside down or simply bumped by a distracted assembler can result in these preforms being scattered about, resulting in wasted time and frustration.

Furthermore, in some cases, the pins of the electrical components may be too short to extend the entire thickness of the electronic board. In this case, it can be difficult to apply solder to the pins resulting in a weak joint, low electrical contact area, and not meeting specific standards of the industry in the particular use case. As such, assembling electronic boards with solder preforms can be a large, time-consuming task.

What is needed are systems and methods for adding solder preforms to pins of electrical components prior to assembly of electronic boards. The systems and methods described herein allow assemblers to place the electrical component into the pinholes of the electronic boards with the preforms bonded to the pins of the electrical components.

SUMMARY

Embodiments of the current disclosure solve the above-described problems and provide a distinct advance in the art by providing a solder preform assembly and methods of preforming solder on electrical components for assembly and completion of electronic boards.

A first embodiment comprises a solder preload assembly for preforming solder on a plurality of electrical components, the solder preload assembly comprising an inset plate comprising a plurality of preload holes, each preload hole of the plurality of preload holes configured to receive solder paste and a pin of an electrical component of the plurality of electrical components, a base comprising a base recess, the base recess configured to receive the inset plate, and wherein the base and the inset plate comprise a material configured to be heated beyond a melting point of the solder paste without melting, and wherein the material of at least the inset plate is further configured to repel liquid solder.

A second embodiment comprises a method of preparing an electronic board with solder preloads using a preload assembly, the method comprising receiving a shim in a base recess of a base, receiving an inset plate in the base recess of the base, wherein the shim is disposed in the base recess between the inset plate and the base, receiving a solder paste in a preload hole of the inset plate, receiving a pin of an electrical component in the preload hole, applying heat to the solder paste to a melting point of the solder paste, cooling the solder paste to bond the solder paste to the pin to form a solder preload, removing the electrical component from the preload hole of the inset plate, inserting the pin of the electrical component into a pinhole of the electronic board, and reheating and re-cooling the solder preload to bond the pin to a conductor of the electronic board.

This summary is provided to introduce a selection of concepts in a simplified form that are further described below in the detailed description. This summary is not intended to identify key features or essential features of the claimed subject matter, nor is it intended to be used to limit the scope of the claimed subject matter. Other aspects and advantages of the current invention will be apparent from the following detailed description of the embodiments and the accompanying drawing figures.

BRIEF DESCRIPTION OF THE DRAWING FIGURES

Embodiments of the invention are described in detail below with reference to the attached drawing figures, wherein.

The drawing figures do not limit the invention to the specific embodiments disclosed and described herein. The drawings are not necessarily to scale, emphasis instead being placed upon clearly illustrating the principles of the invention.

DETAILED DESCRIPTION

The following description of embodiments of the invention references the accompanying illustrations that illustrate specific embodiments in which the invention can be practiced. The embodiments are intended to describe aspects of the invention in sufficient detail to enable those skilled in the art to practice the invention. Other embodiments can be utilized, and changes can be made without departing from the scope of the invention. The following detailed description is, therefore, not to be taken in a limiting sense.

In this description, references to "one embodiment", "an embodiment", "embodiments", "various embodiments", "certain embodiments", "some embodiments", or "other embodiments" mean that the feature or features being referred to are included in at least one embodiment of the technology. Separate references to "one embodiment", "an embodiment", "embodiments", "various embodiments", "certain embodiments", "some embodiments", or "other embodiments" in this description do not necessarily refer to the same embodiment and are also not mutually exclusive unless so stated and/or except as will be readily apparent to those skilled in the art from the description. For example, a feature, structure, act, etc., described in one embodiment may also be included in other embodiments but is not necessarily included. Thus, the current technology can include a variety of combinations and/or integrations of the embodiments described herein.

Generally, embodiments of the current disclosure are directed to a preload assembly for preloading electronic boards. The preload assembly comprises two, three, or more main plates configured to be coupled together. In some embodiments, the preload assembly comprises a base, an inset plate, and a shim, as well as various fasteners for assembly. The base may be configured to receive the inset plate and shim, and the preload assembly may be assembled using the various fasteners.

In some embodiments, when the preload assembly is assembled, the preload assembly may be loaded with solder preloads. The inset plate may be configured to act as the electronics board at this stage and may be configured to receive the solder preloads. The inset plate may be configured with solder preload holes, which may be through holes and/or blind holes. The solder preloads may be disposed into the solder preload holes in positions to receive electrical components for preforming the solder onto pins of the electrical components. The electrical components may be placed such that the pins of the electrical components are received in the solder preload holes with the solder preloads. The shim may be used with the through-hole inset plate providing thermal transfer to pins and simple cleaning and reuse capabilities. Furthermore, the shim may block the back of the through hole, effectively creating a blind hole. Similarly, or alternatively, the shim may not be necessary if the solder preload holes are blind holes in the inset plate.

Once the solder preloads have been loaded into the solder preload holes of the inset plate, heat may be added to preload assembly. Furthermore, a vacuum may be applied in some embodiments as the heat is added. As the solder preloads melt, the vacuum may cause the liquid solder preloads to move from the shim backing toward the electrical component along the pin of the electrical component. The heat may be reduced, allowing the solder to cool and the solder to bond to the pin adjacent to a body of the electrical component. In some embodiments, the heat may be added in a reflow process utilizing a reflow oven with a vacuum.

Once the solder preloads have been heated and added to the pins of the electrical components, the electrical components may be removed from the preload assembly and placed in an electronics board that has additionally been preloaded with a solder preload. The electronics board (comprising the preloaded components) may then be run through another reflow process. In some embodiments, tinning may be provided on the electrical conductors of the electronic board, and additional flux may be applied to replace the flux burned off from the solder preform on the component during the initial reflow process. The second reflow process (not including tinning processes described below) may solder the pin of the electrical component to the electronic board, thereby creating a solid solder joint and an electrical connection between a circuit defined on the electronic board and the electrical component. The solder joint may meet any specification standards required by the particular use case of the electronic board. References to first/second/third processes should not be viewed as restrictive as numerous reflow process for tinning may be added or subtracted as needed.

In some embodiments, the preload assembly may be configured to fit into a jet paste printer, a heating device such as a reflow oven, and/or a similar device configured for solder reflow. The preload assembly may be used with any standard surface mount technology (SMT) line and may be configured to be used and cleaned multiple times throughout the lifespan of the preload assembly.

Figure 1A:
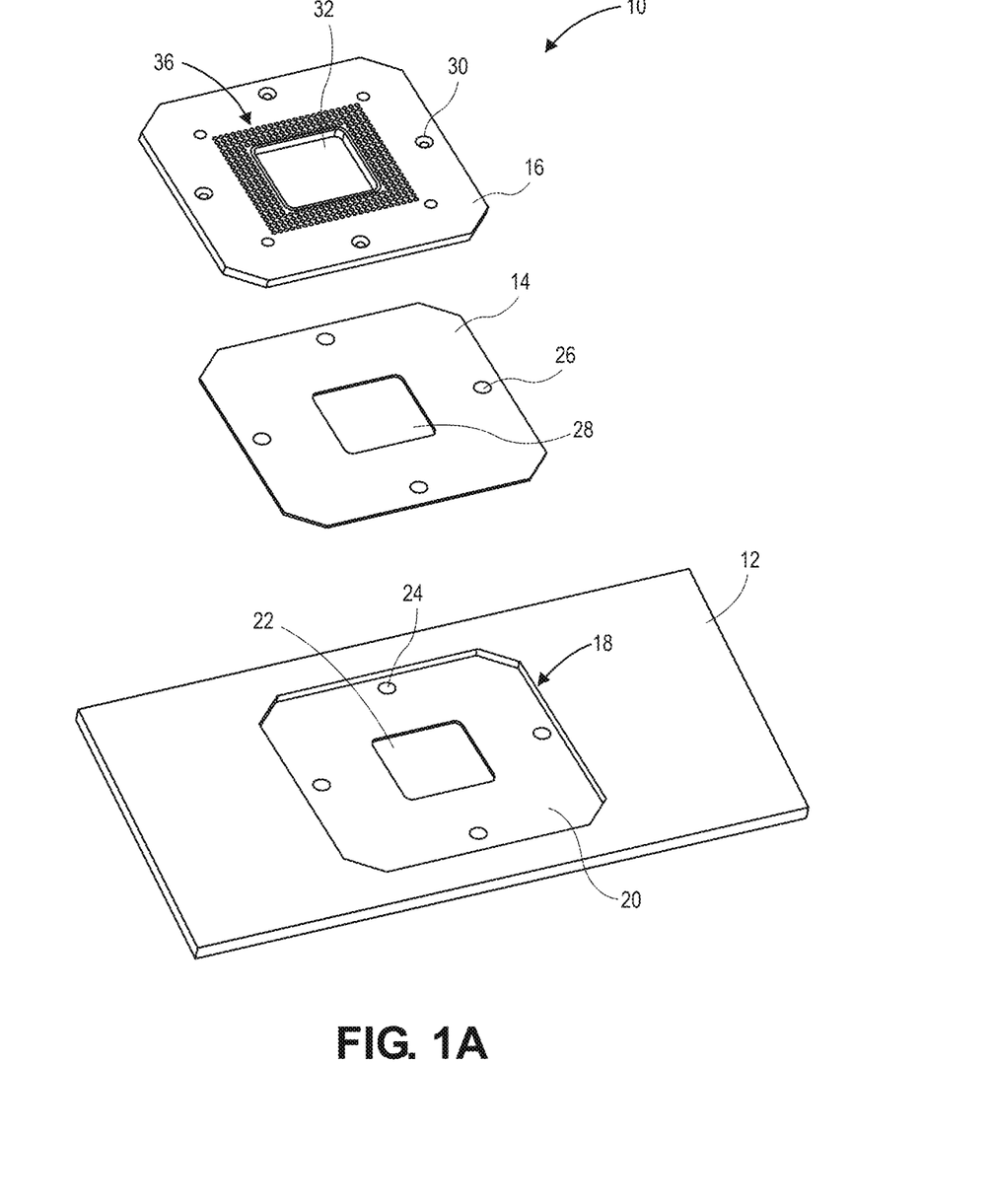
FIGS. 1A and 1B depict an exemplary preload assemblies.
Figure 3A:
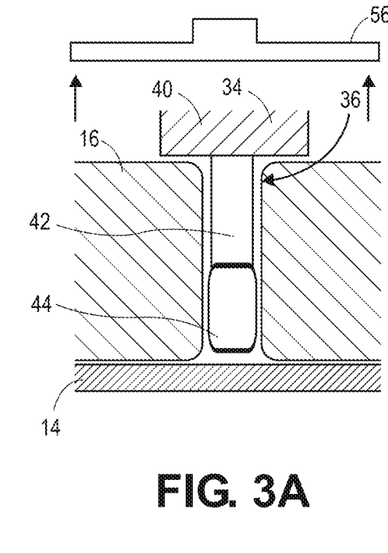
FIGS. 3A-3D depict exemplary inset holes and solder preforming.
Figure 3B:
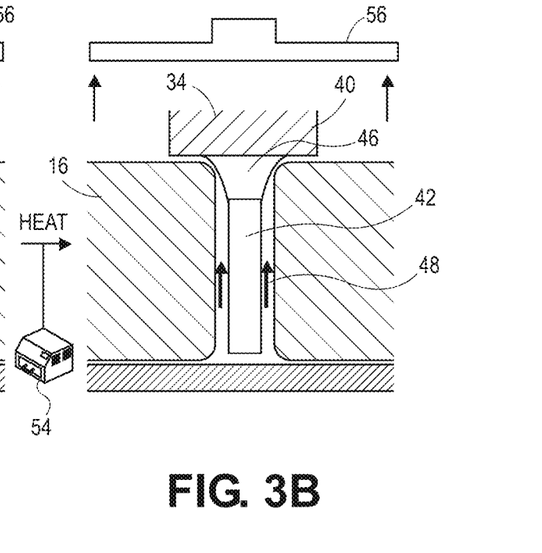
Figure 3C:
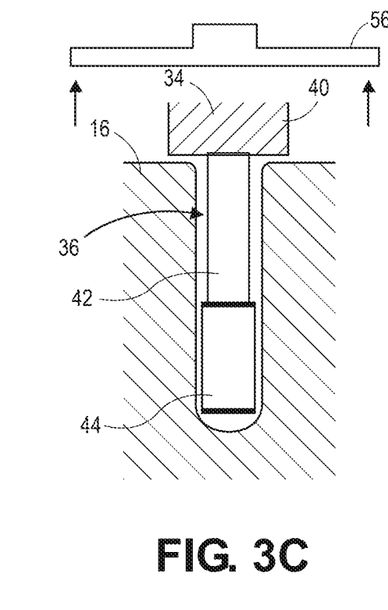
Figure 3D:
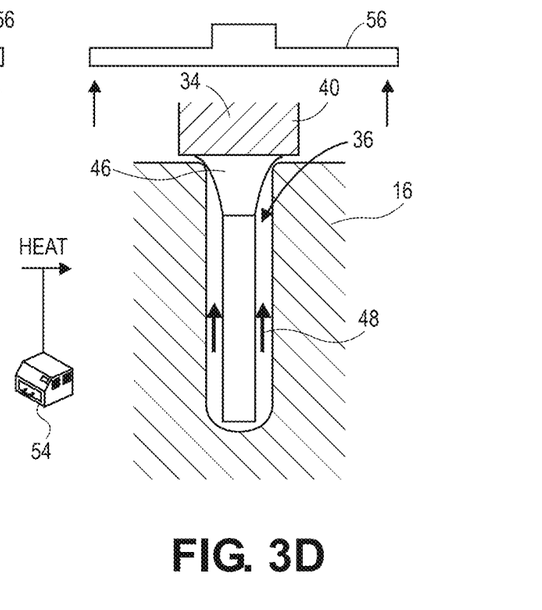

FIG. 1A depicts an embodiment of preload assembly 10, broadly made up of base 12, shim 14, and inset plate 16. In some embodiments, base 12 is configured with base recess 18 for receiving inset plate 16 and shim 14. In some embodiments, inset plate 16 may be configured with one or more instances of preload hole 36, which may be through holes or blind holes. In the case of through holes (as depicted in FIGS. 3A and 3B), shim 14 may be used as a backing to the through holes to receive any number of instances of solder preload 44 (as depicted in FIGS. 3A-3D), provide thermal consistency to the instance(s) of solder preload 44, and provide ease in post-process cleaning. Furthermore, shim 14 effectively changes through holes into blind holes, described in more detail below. However, in the case that inset plate 16 comprises blind holes (as depicted in FIGS. 3C and 3D), shim 14 may not be necessary. Therefore, base 12 may be configured to receive only inset plate 16 or may be configured to receive both of inset plate 16 and shim 14. Accordingly, base recess 18 may be cut to the dimensions of inset plate 16 and/or shim 14. Furthermore, a depth of base recess 18 may be configured to receive both of shim 14 and inset plate 16 or only inset plate 16, depending on the type of preload hole 36 for the specific embodiment.

Figure 2:
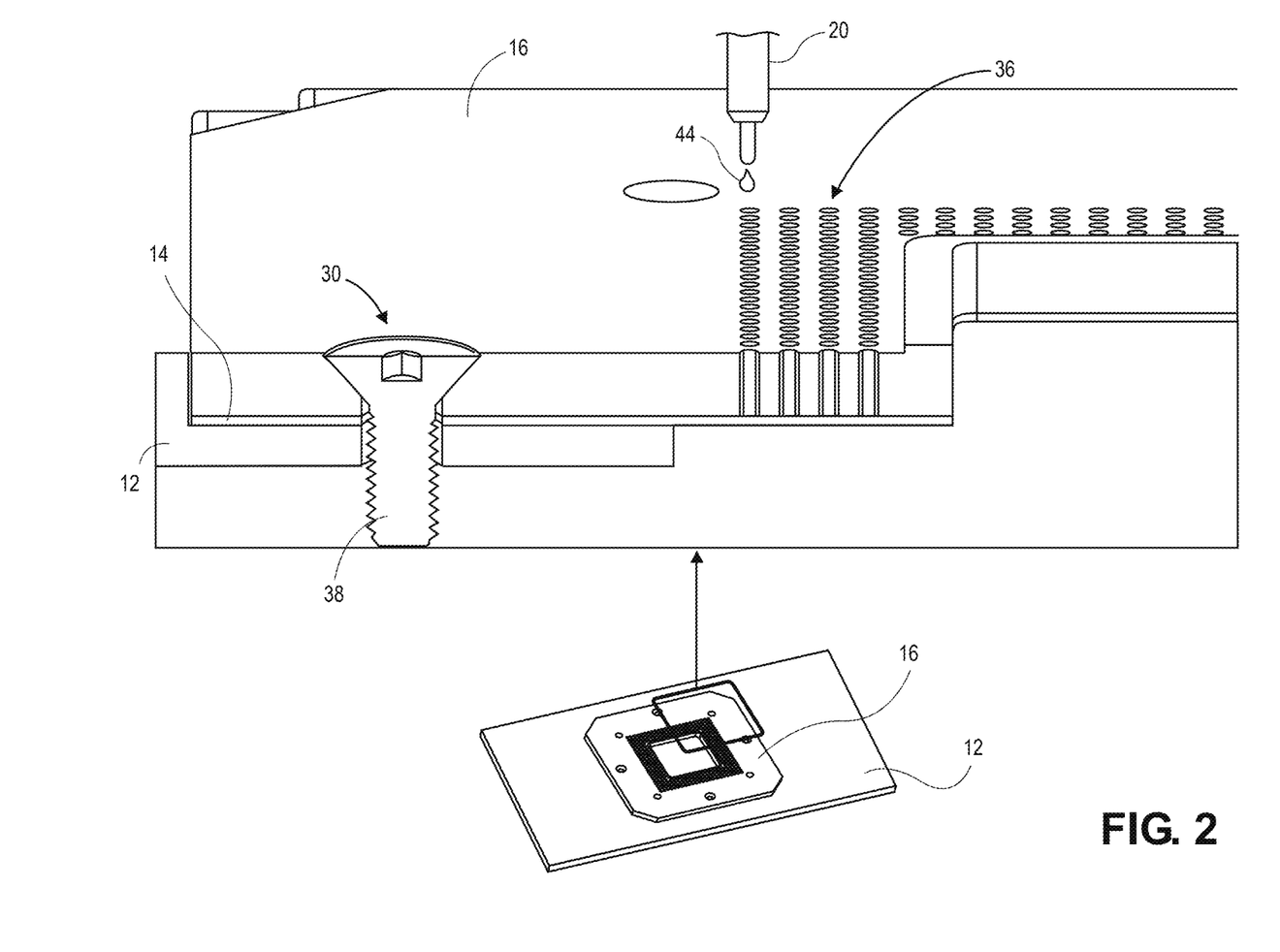
FIG. 2 depicts an embodiment of an inset plate illustrating inset holes.

In some embodiments, shim 14 and/or inset plate 16 may be placed in base recess 18 and secured with fasteners 38 (as depicted in FIG. 2). Here, base 12 comprises base holes 24, inset plate 16 comprises inset holes 30, and shim 14 comprises shim holes 26 configured for fastening the plates together. However, any attachment method, including clamps or any other mechanical fastening method, may be used.

As shown, shim 14 and inset plate 16 may be generally the same size and shape as base recess 18; however, the geometry of shim 14 and inset plate 16 may be any shape that may still allow inset plate 16 and shim 14 to rest inside base recess 18 while shim 14 still blocks a back side of one or more instances of preload hole 36. For example, shim 14 may be smaller than inset plate 16, being sized only large enough to cover any through holes of inset plate 16. Furthermore, as shown, shim 14 may be positioned in base recess 18, and inset plate 16 may be positioned on top of shim 14 in base recess 18. When shim 14 and inset plate 16 are in place, fasteners 38 may be added to secure inset plate 16 and shim 14 to base 12 in base recess 18.

In some embodiments, base 12 may comprise base center hole 22, shim 14 may comprise shim center hole 28, and inset plate 16 may comprise plate center hole 32. The three center holes may generally be of the same dimensions, such that when the plates are secured together, the center holes align. The center holes may aid in disassembling preload assembly 10 when shim 14 and/or inset plate 16 are disposed in base recess 18, providing a location for a user to grip and remove inset plate 16 and shim 14.

In some embodiments, inset plate 16 may comprise polyamide, FR4(fiberglass), Durastone, non-metallic materials, and the like. Generally, in some embodiments, inset plate 16 may comprise any material that may repel or otherwise not stick to solder and withstand reflow temperatures without melting and/or bowing or warping. In some embodiments, inset plate 16 may comprise any material (e.g., aluminum or stainless steel) that will withstand the reflow temperatures and provide a stiff and thin platform for the solder preloads. However, portions including at least one or more instances of preload hole 36 comprise polyamide, FR4(fiberglass), Durastone, non-metallic materials, and the like. Similarly, base 12 and shim 14 may also comprise similar materials, although in some embodiments, base 12 may be metallic (aluminum or stainless steel) or other materials as the solder is not in direct contact with base 12 in the embodiment illustrated in FIG. 1A.

Figure 1B:
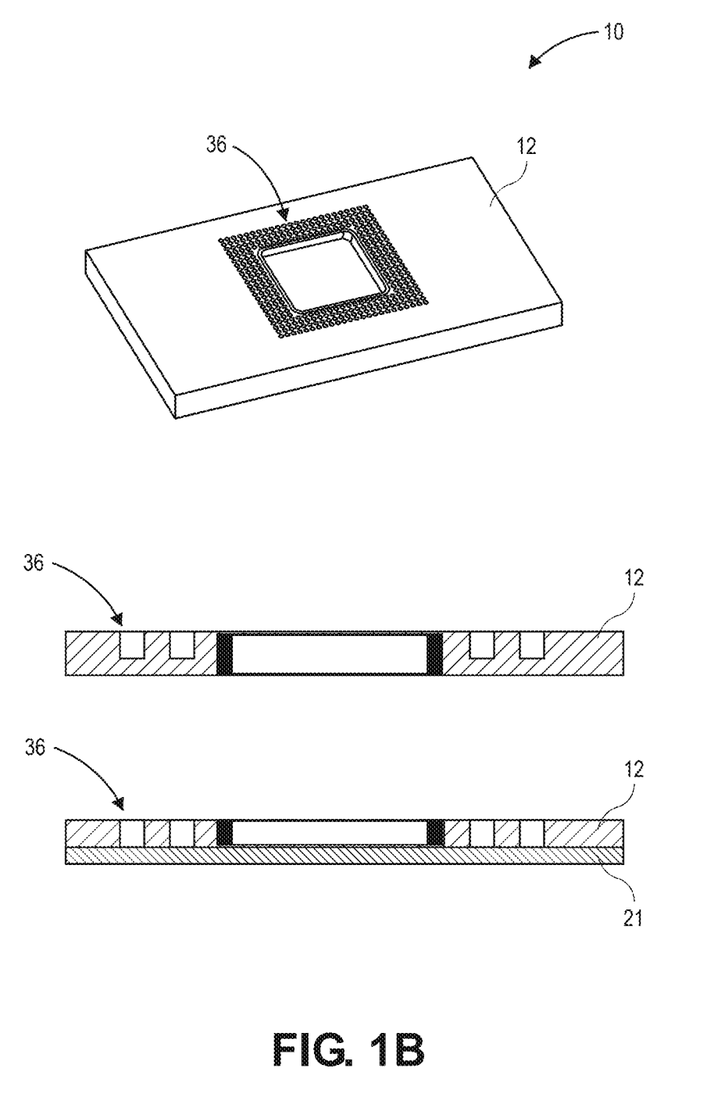

FIG. 1B depicts an embodiment of preload assembly 10 with base 12 comprising a single thin stiff sheet. Here, base 12 comprises one or more instances of preload hole 36 configured to receive solder preload 44 for preloading electronic components prior to insertion into electronic board 50. Here, base 12 comprises a single stiff sheet comprising polyamide, FR4(fiberglass), Durastone, non-metallic materials, and the like. Generally, in some embodiments, base 12 (as shown in FIG. 1B) may comprise any material that may repel or otherwise not stick to solder and withstand reflow temperatures without melting and/or bowing or warping.

In some embodiments, base 12 may be a single use disposable fixture. For example, solder preload 44 may be added to the preload hole 36 and pin 42 of electrical component 40 may be inserted into preload hole 36 as described in embodiments below. base 12 and electrical component 40 may be run through a reflow process adhering solder preload 44 to pin 42 as described below. When the process is complete, and electrical component 40 is removed, base 12 may be simply be discarded. In some embodiments, base 12 may be used multiple times before being discarded. In some embodiments, base 12 may be cleaned and reusable.

In some embodiments, base 12 may comprise blind holes and/or through holes as shown in FIG. 1B. When through holes are used backing plate 21 may be used similarly to shim 14 described above. In this case, backing plate 21 may comprise polyamide, FR4(fiberglass), Durastone, non-metallic materials, and the like, as described above. As such, backing plate 21 may be removed, cleaned, and reused depending on the material. All processes for preloading components described herein apply to the embodiment shown in FIGS. 1A and 1B.

FIG. 2 depicts a close-up cross-section view of preload assembly 10, including shim 14 and inset plate 16 (in turn comprising one or more instances of preload hole 36, which in this case are through holes). As shown, inset plate 16 is placed on shim 14, and both of inset plate 16 and shim 14 are received in base recess 18 of base 12. Inset plate 16 and shim 14 may be secured by fastener 38—in this case, a screw received in inset hole 30, shim hole 26, and base hole 24. In some embodiments, fasteners 38 may be any type of fastener or simply clamps holding the plates together.

Here, one or more instances of preload hole 36 are configured to receive one or more respective instances of solder preload 44 and one or more instances of pin 42 for each of one or more instances of electrical component 40, as shown in FIGS. 3A-3D. Exemplary electrical components may be chips, resistors, capacitors, diodes, transistors, power sources, switches, and the like. After the instance(s) of solder preload 44 are positioned in each of the one or more instances of preload hole 36, preload assembly 10 may be placed in a reflow device such as a reflow oven 54 (as depicted in FIGS. 3A-4B).

Figure 4A:
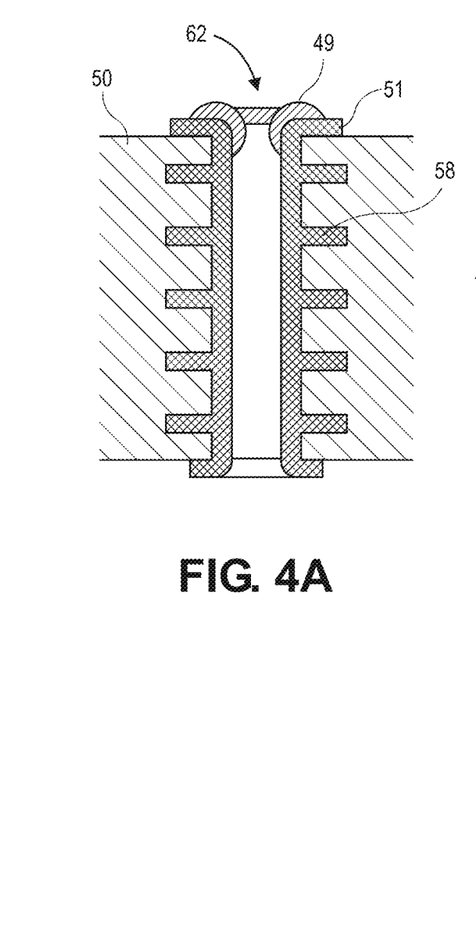
FIGS. 4A and 4B depict an exemplary board tinning process.
Figure 4B:
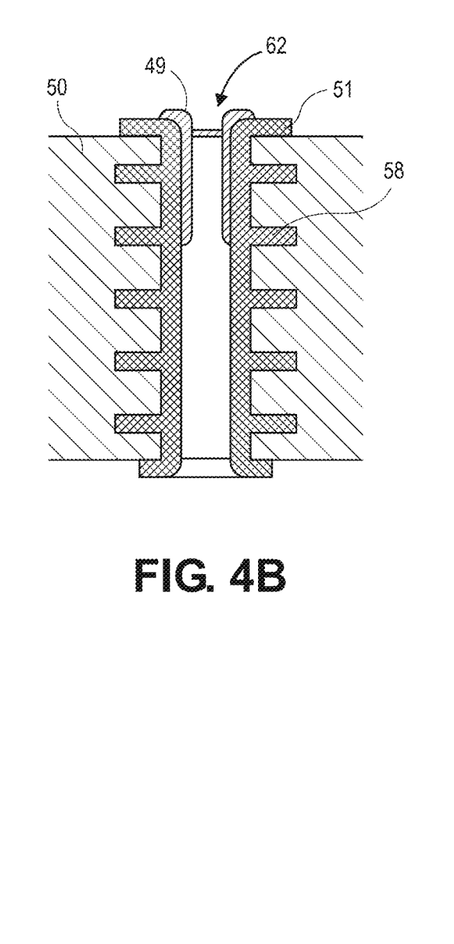

In some embodiments, as shown in FIG. 2, one or more instances of solder preload 44 may be disposed into preload holes by jet paste printer 20. Here, each instance of solder preload 44 may be jet paste or solder paste, with or without flux. The instance(s) of solder preload 44 may be added by a preprogrammed jet paste printer dispensing the instance(s) of solder preload 44 into one or more respective instances of preload hole 36 according to an arrangement of the one or more instances of pin 42 in electronic board 50 (as shown in FIGS. 4A-4B).

FIGS. 3A and 3B depict a closeup cross-section view of a portion of preload assembly 10 illustrating a preload hole 36 through inset plate 16, with shim 14 providing backing for solder preload 44. Also shown are body 34 and pin 42 of electrical component 40, where pin 42 has been inserted into solder preload 44. Here, solder preload 44 is illustrated as a standard donut-shaped solder preload, and pin 42 has been inserted into the donut hole of solder preload 44. Such a donut-shaped preload is exemplary, and any type of solder preload may be used. As described above, solder preload 44 may be any preload or preform material, including solder paste (as shown in FIG. 2). Furthermore, solder preload 44 may rest at the bottom of preload hole 36 and extend up a small amount of preload hole 36, one-fourth of preload hole 36, one-half of preload hole 36, or completely fill preload hole 36. The amount of solder or solder and flux preloaded into preload hole 36 may be based at least in part on the application. Accordingly, any amount of solder preload 44 may be pre-placed in preload hole 36.

FIG. 3A depicts electrical component 40 (comprising one or more instances of pin 42) inserted into preload hole 36 of inset plate 16 and into solder preload 44 resting on shim 14. In FIG. 3A, preload assembly 10 has not been heated. Therefore, solder preload 44 is in solid form (or paste) and has not yet bonded to pin 42. FIG. 3A depicts preload assembly 10 before the heating process; in FIG. 3A, preload assembly 10 is prepared to undergo the heating process to bond one or more instances of solder preload 44 to one or more corresponding instances of pin 42.

In some embodiments, preload assembly 10 may be heated by any known solder reflow process. As depicted, preload assembly 10 may be run through solder reflow oven 54. However, any type of solder reflow process and any type of reflow device may be used since the material of preload assembly 10 is specifically selected to have the required heat flow characteristics and solder rejection properties necessary for solder preload 44 to melt and adhere to pin 42 and not to inset plate 16 and shim 14, as discussed below.

In some embodiments, preload assembly 10 may comprise material that may withstand the heat of the solder reflow process, provide heat flow properties to melt the solder preload 44, and reject the adhesive properties of the solder preload 44. For example, the heat necessary to melt solder preload may depend at least in part on the composition of the solder preload 44. Temperatures may range between 194 degrees Fahrenheit (90 degrees Celsius) and 840 degrees Fahrenheit (450 degrees Celsius). In some embodiments, a typical temperature may be approximately 230 degrees Celsius. In some embodiments, Inset plate 16, shim 14, and base 12 may be made of a non-metallic composite, such as fiberglass. In some such embodiments, the material may be FR4 fiberglass. In some embodiments, the material may repel liquid solder, such that the instance(s) of solder preload 44 bond exclusively to the corresponding instance(s) of pin 42 and not to inset plate 16 and/or shim 14. In some embodiments, inset plate 16, shim 14, and base 12 may be the same composition or may be different materials, as necessary to provide the thermal flow properties necessary to the preload hole 36, pin 42, and solder preload 44.

In some embodiments, dimensions of the components of preload assembly 10 may be designed specifically to control the heat flow to the preload hole 36 and solder preload 44. When heated in reflow oven 54, a specific temperature may be selected based on preload assembly 10 material, the thermal properties of the material, and the geometry of the components.

As the heat flows into preload hole 36, the temperature reaches the melting point of solder preload 44. Once the temperature reaches the melting point, each instance of solder preload 44 melts. As the instance(s) of solder preload 44 melt, each instance of solder preload 44 moves toward and bonds to the corresponding instance of pin 42 of electrical component 40, becoming preform solder 46, as shown in FIG. 3B. The movement of solder preload 44 in its liquid state is shown by arrows 48. In some embodiments, the solder preload 44, once liquified, may move upward naturally based on the properties of solder preload 44 and pin 42 due to heating, heat flow direction, airflow direction, capillary action, and the like. In some embodiments, vacuum may be applied by vacuum pump 56 to move the air upward, assisting or causing the movement of solder preload 44 once liquified. In some embodiments, reflow oven 54 comprises vacuum pump 56.

The movement of solder preload 44 may be dictated by a wicking action. In some embodiments, the dimensions of pin 42, preload hole 36, and the space therebetween are based on providing the wicking action according to the fluid dynamics of the solder. In some embodiments, a diameter of preload hole 36 can be defined as a ratio of the pin to provide the correct fluid dynamics of the solder to provide the wicking action. For example, in some embodiments, the diameter of preload hole 36 may be greater than 2.5 times and less than 3.125 times; greater than 2 times and less than 4 times; greater than 2.25 times and less than 3.88 times; or greater than 3 times and less than 3.5 times the pin diameter. In some embodiments, the difference in diameter between pinhole 62 and pin 42 is 16-20 thousandths, 10-20 thousandths, or 7-20 thousandths of an inch.

FIGS. 3C and 3D depict an exemplary embodiment of preload assembly 10 with preload hole 36 configured as a blind hole, or "cup." FIG. 3C depicts solder preload 44 positioned at the bottom of preload hole 36 with pin 42 contacting solder preload 44, which may be a solid solder preload or solder paste. Again, heat is added by way of reflow oven 54, and solder preload 44 reaches its melting point and becomes a liquid. As each instance of solder preload 44 liquefies, it moves upward toward electrical component 40 and away from the bottom of the cup. As the solder reaches electrical component 40 and begins to cool, the liquid solder solidifies, bonding to pin 42 and creating preform solder 46 (as shown in FIG. 3D). Because the cup that is depicted in FIGS. 3C-3D creates a closed end to preload hole 36, shim 14 may not be necessary in this blind-hole configuration. As such, shim 14 may only be used in the through-hole configuration of FIGS. 3A and 3B.

Once preload assembly 10 has cooled, electrical component 40 may be removed from inset plate 16 with preform solder 46 attached to pin 42 at electrical component 40. As described above, electrical component 40 is exemplary and may represent any of a plurality of electrical components. As shown in FIGS. 1A-B and 2, inset plate 16 may comprise many instances of preload hole 36 for preloading solder onto pins of a plurality of electrical components. In some cases, all components that will populate an electronic board may be preloaded simultaneously on preload assembly 10. As such, in some cases, only a single pass through reflow oven 54 will preload all components for an electronic board.

In some embodiments, preprocessing of electronic board 50 may be performed to further provide better electrical contact and solidify the solder joint. As shown in FIGS. 4A and 4B, a tinning process may be performed. The tinning process described herein may be applied to any soldering process for adding components to electronic boards. The application of this tinning process to preload assembly 10 is exemplary only.

In some embodiments, small amounts of tinning solder 49 may be added to conductors 58 around pinhole 62, in some embodiments, comprising plated through hole 51. Tinning solder 49 may comprise solder, solder paste, or the like and may be added around the rim and/or into pinhole 62. Tinning solder 49 may be applied to provide additional solder to pinhole 62 for bonding pin 42 to electronic board 50 and to provide electrical connections to conductors 58.

After tinning solder 49 has been applied to the rim and/or interior of pinhole 62, electronic board 50 may be put through reflow oven 54 providing an additional reflow process. As heat is added, tinning solder 49, typically comprising solder paste, may melt adhering to pinhole 62 comprising plated through hole 51. As shown in FIG. 4B, tinning solder 49 has melted providing additional solder around the rim and/or on the interior of pinhole 62. Here, tinning solder 49 is provided on the backside of electronic board 50; however, tinning solder 49 may be provided on either or both sides of electronic board 50. Tinning solder 49 may be applied to a component side and/or a conductor side of electronic board 50. Tinning solder 49 may be applied in a ring around the component side, allowing access to pinhole 62 for insertion of pin 42. Tinning solder 49 may also be applied so as to form a ring around the conductor side or completely cover the conductor side of pinhole 62. In some embodiments, small amounts of solder paste may be added around pinhole 62 on both or either side of pinhole 62 to apply more solder to complete solder joint 60 (FIG. 5B). The tinning processes described herein applies to any reflow or hand soldering performed down the line agnostic of shape or type of hole or type of connection. As such, the tinning process is not limited to the use case of preload assembly 10.

Furthermore, it should be noted that clearance between tinning solder 49 around the rim and interior of pinhole 62 should be maintained to avoid restricting insertion of pin 42 on the component side. Furthermore, the pin-to-pinhole ratios and sizes described herein also apply when tinning solder 49 is provided in pinhole 62.

In some embodiments, after electronic board 50 has cooled from the reflow process, tape may be added to the backside of electronic board 50. The tape may be added for the next step in the process; adding the paste fill to pinhole 62 prior to insertion of pin 42.

FIGS. 4A-4B and 5A-5B depict plated through hole 51. In some embodiments, electronic board 50 comprises plated through hole 51. Plated through hole 51 provides electrical connections through any layer of the board as shown by conductors 58 connecting the electrical component 40 to various other components and leads. Plated through hole 51 may provide additional surface area of conductive material to ensure a solid electrical connection between pin 42 and the leads and other components of electronic board 50. Furthermore, plated through hole 51 provides a firm joint between pin 42 and electronic board 50. As electronic board 50 typically comprises FR4 (fiberglass), which repels solder, plated through hole 51, in some embodiments, comprises materials for adhering to solder such as, for example, copper, gold, silver, lead, or any other conductive material that will adhere to solder.

Figure 5A:
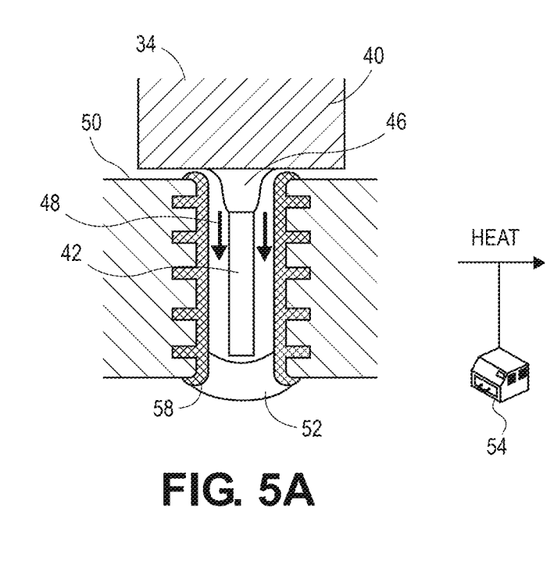
FIGS. 5A and 5B depict embodiments of completing a solder joint in an electronic board.
Figure 5B:
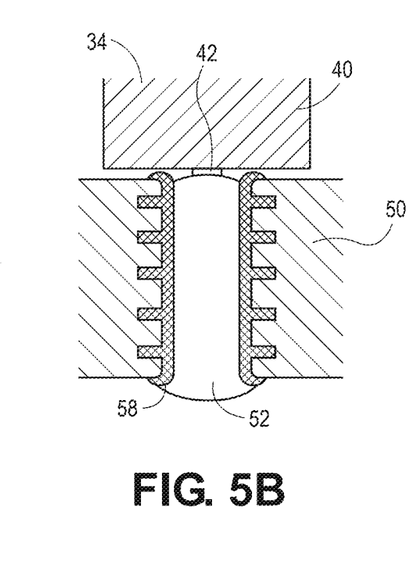

In some embodiments, as shown in FIGS. 5A-5B electronic board 50 may be preloaded with solder, solder paste, and/or additional flux at board preload 52 after the tinning process described above. The additional flux may replace the flux burned off during the preloading phase of electrical component 40 described above. As such, pin 42, electronic board 50, and conductors 58 may be clean and prepared for a solid bond with preform solder 46 and board preload 52 as heat is applied. Board preload 52 may be applied to a component side and/or a conductor side of electronic board 50. Board preload 52 may be applied in a ring around the component side, allowing access to pinhole 62 for insertion of pin 42. Board preload 52 may also be applied so as to form a ring around the conductor side or completely cover the conductor side of pinhole 62. In some embodiments, small amounts of solder paste may be added around pinhole 62 on both or either side of pinhole 62 to apply more solder to complete solder joint 60. In some embodiments, tape is added to prevent board preload from coming out of pinhole 62.

After electrical component 40 has been preloaded with solder and pinhole 62 has been preload and/or tinned, electrical component 40 may be added to electronic board 50, as shown in FIGS. 5A and 5B. Electronic board 50 may be any printed circuit board or wiring board. Electronic board 50 comprises conductive traces (represented by conductors 58) that control the flow of electricity between the plurality of electrical components positioned on the electronic board 50.

Pin 42 may be inserted into pinhole 62 as shown in FIG. 5A. Board preload 52 may have been added to electronic board as described above. In some embodiments, the above-described tinning process may also have been performed providing additional solder to the component side, the trace side, and/or the interior of pinhole 62 (shown in FIGS. 4A and 4B). As such, a precise amount of solder may be provided to pin 42 to provide the bond and electrical connections desired.

The movement of board preload 52 may be dictated by the wicking action described above. Accordingly, in some embodiments, a diameter of pinhole 62 can be defined as a ratio of the pin to provide the correct fluid dynamics of the solder to provide the wicking action. For example, in some embodiments, the diameter of pinhole 62 may be greater than 2.5 times and less than 3.125 times; greater than 2 times and less than 4 times; greater than 2.25 times and less than 3.88 times; or greater than 3 times and less than 3.5 times the pin diameter. In some embodiments, the different in diameter between pinhole 62 and pin 42 is 16-20 thousandths, 10-20 thousandths, or 7-20 thousandths of an inch.

As heat is applied by reflow oven 54, preform solder 46 and board preload 52 begin to melt. As the solder liquefies, preform solder 46 moves (indicated by arrows 48), by the wicking process and potentially aided by the vacuum process described above, from electrical component 40 toward board preload 52. When preform solder 46 comes into contact with board preload 52, preform solder 46 and board preload 52 may combine to form solder joint 60. Solder joint 60 may bond pin 42 to conductors 58 to facilitate the flow of electricity to and from electrical component 40. Furthermore, solder joint 60 may be strong enough to connect electrical component 40 to electronic board 50 mechanically. Solder joint 60 may meet all specification standards for the application of electronic board 50.

Figure 6:
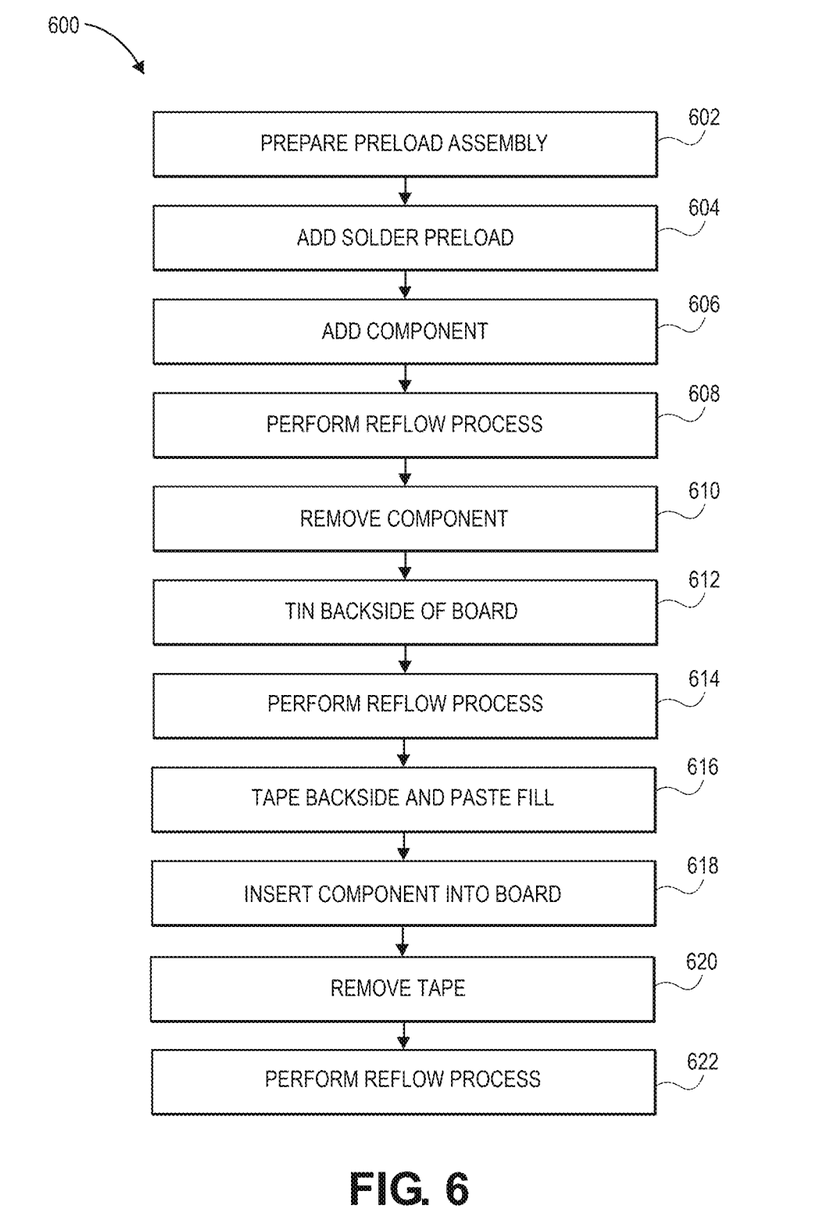
FIG. 6 depicts an exemplary flow diagram illustrating a process of preforming solder on electrical components, board tinning, and assembling the electronic board.

FIG. 6 depicts a flow chart 600 illustrating a method of preloading an electronic board 50 using preload assembly 10. At step 602, preload assembly 10 may be assembled. Shim 14 may be inserted into base 12, and inset plate 16 may be positioned on top of shim 14, such that (as discussed above) shim 14 is positioned between inset plate 16 and base 12. In some embodiments, base 12 may be configured with base recess 18 for receiving shim 14 and/or inset plate 16. When shim 14 and inset plate 16 are positioned in base recess 18, fasteners may be used to secure shim 14 and inset plate 16 to base 12, as described above. As such, base 12, shim 14, and inset plate 16 may be coupled and configured to receive solder preforms and electrical components. Here, shim 14 may be provided as a backing to hold solder preload 44 for pin 42 to contact. Furthermore, as described above, shim 14 may be configured with the appropriate materials and dimensions to provide the proper heat transfer to preload hole 36 to melt solder preload 44 and move solder preload 44 to electrical component 40 before cooling and bonding solder preload 44 to pin 42.

As described in step 602 above, shim 14 may be positioned between inset plate 16 and base 12 in base recess 18; however, in some embodiments, shim 14 is not necessary. In some embodiments, preload hole 36 may be configured as a blind hole providing an enclosed cup (as depicted in FIGS. 3C and 3D) for receiving solder preload 44. As there is no backing required, shim 14 may not be added to preload assembly 10. As described above, inset plate 16 may be configured with the material and dimensions to provide the appropriate heat flow to preload hole 36 needed to melt solder preload 44 and move solder preload 44 to electrical component 40 before cooling and bonding to pin 42.

At step 604, solder preload 44 is added to preload hole 36. As described above, solder preload 44 may be any type of standard solder preload, solder paste, solder flux, or any combination thereof. Solder preload 44 may be composed so as to melt in a range of 194 degrees Fahrenheit (90 degrees Celsius) and 840 degrees Fahrenheit (450 degrees Celsius) based on the composition of solder preload 44. In some embodiments, solder preload 44 may be a solid preload that may rest at the bottom of preload hole 36 In other embodiments, solder preload 44 may be a solder paste that is applied in preload hole 36, at the bottom of preload hole 36, or at the top of preload hole 36.

At step 606, electrical component 40 is added to preload assembly 10. Electrical component 40 may be any standard component such as a resistor, capacitor, diode, transistor, power source, switch, packaged component, or the like. Furthermore, electrical component 40 is a single example out of a plurality of electrical components that may be assembled in a plurality of preload holes configured in inset plate 16, as shown in FIG. 2. Electrical component 40 may comprise one or more instances of pin 42 that are inserted into one or more corresponding instances of preload hole 36. In some embodiments, as described above, pin 42 may be shorter than typical pins (which extend through a standard electronic board and provide a simple location for soldering electrical components to the standard electronics board). As such, preload assembly 10 can be used for preloading pin 42 because the pins do not extend past the thickness of inset plate 16 (plus shim 14, if used).

At step 608, a reflow process is performed on preload assembly 10. Preload assembly 10, including electrical component 40, may be inserted into reflow oven 54 or any other heating device used for soldering or solder reflow purposes (such as a heat lamp or a vacuum oven). In some embodiments, a hot air pen, soldering iron, or the like may also be used. Preload assembly 10 is then heated to or above a melting point of solder preload 44. As solder preload 44 melts, solder preload 44 becomes liquid and may move upward toward electrical component 40 according to arrows 48 shown in FIGS. 3B and 3D. Once the liquid solder has reached electrical component 40, preload assembly 10 may be cooled, allowing preform solder 46 to form around pin 42 adjacent to electrical component 40. Accordingly, electrical component 40 is now preloaded with solder to aid in creating a solid solder joint in electronic board 50.

At step 610, electrical component 40 may be removed from preload assembly 10. As described above, electrical component 40 may represent a plurality of components to be assembled on electronic board 50. Therefore, each of the plurality of components may be removed and used to populate electronic board 50. In some embodiments, inset plate 16 may simultaneously support all components for the circuit or components to assemble a plurality of circuits.

Steps 612-620 presented below illustrate a tinning process that may be applied to any electronic board soldering process. Steps 612-620 are applied to preload assembly 10 herein as an example but may represent an independent process that may be completed on any electronic board with or without prior steps 602-610.

At step 612, tinning solder 49 may be added to conductors 58 around pinhole 62. Tinning solder 49 may comprise solder, solder paste, or the like. Tinning solder 49 may be applied to provide additional solder to pinhole 62 for bonding pin 42 to electronic board 50 and to provide electrical connections to conductors 58. Tinning solder 49 may be applied to a component side and/or a conductor side of electronic board 50. Tinning solder 49 may be applied in a ring around the component side, allowing access to pinhole 62 for insertion of pin 42. Tinning solder 49 may also be applied so as to form a ring around the conductor side or completely cover the conductor side of pinhole 62.

After tinning solder 49 has been applied to pinhole 62, electronic board 50 may be put through reflow oven 54 providing an additional reflow process at step 614. As heat is added, tinning solder 49, typically comprising solder paste, may melt adhering to pinhole 62. As shown in FIG. 4B, tinning solder 49 has melted providing additional solder around the rim and on the interior of pinhole 62. The tinning processes described herein apply to any reflow or hand soldering performed down the line agnostic of shape or type of hole or type of connection.

At step 616, tape may be added to a backside of electronic board 50 and solder paste may be added. The tape may be added for adding the board preload 52 without losing any of board preload 52 out of electronic board 50.

Continuing with step 616, board preload 52 may be solder paste, solder, additional flux, or any combination thereof. In some embodiments, board preload 52 may be added near or at a trace side, or solder side, of electronic board 50 opposite electrical component 40. In some embodiments, board preload 52 may be added and bonded to conductors 58 and/or to plated through hole 51. In some embodiments, board preload 52 may be added in pinhole 62 and bonded to the interior of plated through hole 51 as described below. Conductors 58 (such as conductive traces) may be connected to the circuit on electronic board 50 so that the plurality of instances of electrical component 40, when electrically coupled to conductors 58, completes a desired circuit.

In some embodiments, board preload 52 comprises solder and flux. The flux may be provided in an amount to both provide for board preload 52 and replace flux burned off from preform solder 46 from previous reflow processes described above. As such, flux may be applied to the interior of pinhole 62 and the surface of pin 42 to prepare them for bonding, and flux may be applied for both of board preload 52 and preform solder 46.

At step 618, electrical component 40 is added to electronic board 50. One or more instances of pin 42 of electrical component 40 may be inserted into one or more corresponding instances of pinhole 62 of electronic board 50. Furthermore, a plurality of components that have been preloaded as described above may be added to electronic board 50 to complete the electric circuit of electronic board 50.

After electrical component 40 is positioned into pinhole 62, at step 620, the tape may be removed. The tinning process described in steps 612-620 and, in some embodiments, including step 622, may be applied to any electronic board and component soldering method. As such, the tinning process of steps 612-620 are provided here as an example as applied to preload assembly 10.

At step 622, electronic board 50, assembled with all (or some) electrical components, is run through another reflow process. Electronic board 50 may be inserted into reflow oven 54 or any other heating device specifically used for soldering or solder reflow purposes as described above in reference to the first reflow process. Heat is then applied to electronic board 50, assembled with electrical component 40. As pinhole 62, preform solder 46, and board preload 52 are heated, board preload 52 and preform solder 46 melt. Generally, preform solder 46 liquefies and moves toward the solder side away from electrical component 40 and combines with board preload 52 to form solder joint 60, thereby bonding one or more instances of pin 42 to conductors 58. As such, electrical component 40 can thus be electrically coupled with the circuit of electronic board 50. In some embodiments, board preload 52 may be added to either side of electronic board 50 and/or in pinhole 62 to provide enough solder and flux to complete solder joint 60 to the desired specifications.

In some aspects, the techniques described herein relate to a solder preload assembly for preforming solder on a plurality of electrical components, the solder preload assembly including: an inset plate including a plurality of preload holes, each preload hole of the plurality of preload holes configured to receive solder paste and a pin of an electrical component of the plurality of electrical components; a base including a base recess, the base recess configured to receive the inset plate, and wherein the base and the inset plate include a material configured to be heated beyond a melting point of the solder paste without melting, and wherein the material of at least the inset plate is further configured to repel liquid solder.

In some aspects, the techniques described herein relate to a solder preload assembly, wherein the plurality of preload holes is through holes; further including a shim configured to be disposed between the inset plate and the base in the base recess.

In some aspects, the techniques described herein relate to a solder preload assembly, further including fasteners configured to couple the inset plate, the shim, and the base.

In some aspects, the techniques described herein relate to a solder preload assembly, wherein the plurality of preload holes is blind holes and is configured to support the solder paste therein.

In some aspects, the techniques described herein relate to a solder preload assembly, wherein the material is fiberglass and is configured to be heated to temperatures above 230 degrees Celsius without warping.

In some aspects, the techniques described herein relate to a method of preparing an electronic board with solder preloads using a preload assembly, the method including: receiving an inset plate in a base recess of a base; receiving a solder paste in a preload hole of the inset plate; receiving a pin of an electrical component in the preload hole; applying heat to the solder paste to a melting point of the solder paste; cooling the solder paste to bond the solder paste to the pin to form a solder preload; removing the preloaded electrical component from the preload hole of the inset plate; inserting the pin of the electrical component into a pinhole of the electronic board; and reheating and re-cooling the solder preload to bond the pin to a conductor of the electronic board.

In some aspects, the techniques described herein relate to a method, further including preparing the electronic board by adding tinning solder to an interior or a rim of the pinhole of the electronic board.

In some aspects, the techniques described herein relate to a method, wherein the tinning solder is a solder paste including solder and flux.

In some aspects, the techniques described herein relate to a method, wherein the heat is applied by a reflow oven and the inset plate and the base are configured to be inserted into the reflow oven.

In some aspects, the techniques described herein relate to a method, wherein the reflow oven includes a vacuum, wherein the method further includes moving the solder preload, while in a liquid state, into the pinhole of the electronic board, wherein the solder preload thereby bonds to the pin within the pinhole.

In some aspects, the techniques described herein relate to a method, wherein the preload hole of the inset plate is a through hole, wherein the method further includes: covering the through hole at a bottom of the through hole by a shim, wherein the shim is configured to be inserted into the base recess between the base and the inset plate.

In some aspects, the techniques described herein relate to a method, further including coupling the inset plate, the base, and the shim with fasteners.

In some aspects, the techniques described herein relate to a method, wherein at least the preload hole is a blind hole.

In some aspects, the techniques described herein relate to a method, wherein the solder preload is solder paste including solder and flux.

In some aspects, the techniques described herein relate to a method of preparing an electronic board with solder preloads using a preload assembly, the method including: receiving a shim in a base recess of a base; receiving an inset plate in the base recess of the base, wherein the shim is disposed in the base recess between the inset plate and the base; receiving a solder paste in a preload hole of the inset plate; receiving a pin of an electrical component in the preload hole; applying heat to the solder paste to a melting point of the solder paste; cooling the solder paste to bond the solder paste to the pin to form a solder preload; removing the electrical component from the preload hole of the inset plate; inserting the pin of the electrical component into a pinhole of the electronic board; and reheating and re-cooling the solder preload to bond the pin to a conductor of the electronic board.

In some aspects, the techniques described herein relate to a method, further including preparing the electronic board by adding solder paste including solder and flux to an interior or a rim of the pinhole of the electronic board.

In some aspects, the techniques described herein relate to a method, wherein the heat is applied by a reflow oven and the inset plate and the base are configured to be inserted into the reflow oven.

In some aspects, the techniques described herein relate to a method, further including moving the solder preload by a wicking action through an interior of the pinhole based on difference in diameter of the pin and the pinhole and fluid dynamics of the solder paste.

In some aspects, the techniques described herein relate to a method, wherein the difference in diameter is selected based on the fluid dynamics of the solder paste.

In some aspects, the techniques described herein relate to a method, wherein the shim, the base, and the inset plate include a fiberglass material configured to be heated to temperatures above 230 degrees Celsius without warping.

Having thus described various embodiments of the disclosure, what is claimed as new and desired to be protected by Letters Patent includes the following:

1. A method of preparing an electronic board with solder preloads using a preload assembly comprising a base and an inset plate, the method comprising:
   receiving the inset plate in a base recess of the base;
   receiving a solder paste in a preload hole of the inset plate;
   receiving a pin of an electrical component in the preload hole;
   applying heat to the solder paste to a melting point of the solder paste;
   cooling the solder paste to bond the solder paste to the pin to form a solder preload;
   removing the electrical component from the preload hole of the inset plate;
   inserting the pin of the electrical component into a pinhole of the electronic board; and
   reheating and re-cooling the solder preload to bond the pin to a conductor of the electronic board.

2. The method of claim 1, further comprising preparing the electronic board by adding tinning solder to an interior or a rim of the pinhole of the electronic board.

3. The method of claim 2, wherein the tinning solder is a paste comprising solder and flux.

4. The method of claim 1, wherein the heat is applied by a reflow oven and the inset plate and the base are configured to be inserted into the reflow oven.

5. The method of claim 4,
   wherein the reflow oven comprises a vacuum,
   wherein the method further comprises moving the solder preload, while in a liquid state, into the pinhole of the electronic board,
   wherein the solder preload thereby bonds to the pin within the pinhole.

6. The method of claim 1,
   wherein the preload hole of the inset plate is a through hole,
   wherein the method further comprises:
      covering the through hole at a bottom of the through hole by a shim,
      wherein the shim is configured to be inserted into the base recess between the base and the inset plate.

7. The method of claim 6, further comprising coupling the inset plate, the base, and the shim with fasteners.

8. The method of claim 1, wherein at least the preload hole is a blind hole.

9. The method of claim 1, wherein the solder preload is a paste comprising solder and flux.

10. A method of preparing an electronic board with solder preloads using a preload assembly comprising a shim, a base, and an inset plate, the method comprising:
   receiving the shim in a base recess of the base;
   receiving the inset plate in the base recess of the base, wherein the shim is disposed in the base recess between the inset plate and the base;
   receiving a solder paste in a preload hole of the inset plate;
   receiving a pin of an electrical component in the preload hole;
   applying heat to the solder paste to a melting point of the solder paste;
   cooling the solder paste to bond the solder paste to the pin to form a solder preload;
   removing the electrical component from the preload hole of the inset plate;
   inserting the pin of the electrical component into a pinhole of the electronic board; and
   reheating and re-cooling the solder preload to bond the pin to a conductor of the electronic board.

11. The method of claim 10, further comprising preparing the electronic board by adding a paste comprising solder and flux to an interior or a rim of the pinhole of the electronic board.

12. The method of claim 10, wherein the heat is applied by a reflow oven and the inset plate and the base are configured to be inserted into the reflow oven.

13. The method of claim 12, further comprising moving the solder preload by a wicking action through an interior of the pinhole based on a difference in diameter of the pin and the pinhole and further based on fluid dynamics of the solder paste.

14. The method of claim 13, wherein the difference in the diameter of the pin and the pinhole is selected based on the fluid dynamics of the solder paste.

15. The method of claim 10, wherein the shim, the base, and the inset plate comprise a fiberglass material configured to be heated to temperatures above 230 degrees Celsius without warping.

16. A method of preparing an electronic board with solder preloads using a preload assembly comprising a base and an inset plate, the method comprising:
   receiving the inset plate in a base recess of the base;
   fastening the inset plate to the base;
   receiving a solder paste in a preload hole of the inset plate;
   receiving a pin of an electrical component in the preload hole;
   applying heat to the solder paste to a melting point of the solder paste;
   cooling the solder paste to bond the solder paste to the pin to form a solder preload;
   removing the electrical component from the preload hole of the inset plate;
   preparing the electronic board by adding a paste comprising solder and flux to an interior or a rim of a pinhole of the electronic board;
   inserting the pin of the electrical component into the pinhole of the electronic board; and
   reheating and re-cooling the solder preload to bond the pin to a conductor of the electronic board.

17. The method of claim 16, further comprising:
   covering a through hole at a bottom of the through hole by a shim,
   wherein the shim is configured to be inserted into the base recess between the base and the inset plate.

18. The method of claim 16, wherein the preload hole is a blind hole and is configured to support the solder paste therein.

19. The method of claim 16, further comprising moving the solder preload by a wicking action through a pinhole interior of the pinhole based on a difference in diameter of the pin and the pinhole and further based on fluid dynamics of the solder paste.

20. The method of claim 16, further comprising:
   applying the heat by a reflow oven,
   wherein the inset plate and the base are configured to be inserted into the reflow oven.

* * * * *